US008333261B2

(12) United States Patent
Barnes

(10) Patent No.: US 8,333,261 B2
(45) Date of Patent: Dec. 18, 2012

(54) COMPACT SUBWOOFER CABINET

(76) Inventor: Ryan L. Barnes, Layton, UT (US)

( * ) Notice: Subject to any disclaimer, the term of this patent is extended or adjusted under 35 U.S.C. 154(b) by 0 days.

(21) Appl. No.: 13/209,394

(22) Filed: Aug. 13, 2011

(65) Prior Publication Data

US 2012/0048643 A1 Mar. 1, 2012

Related U.S. Application Data

(60) Provisional application No. 61/377,084, filed on Aug. 25, 2010.

(51) Int. Cl.
*H05K 5/00* (2006.01)

(52) U.S. Cl. ......... 181/145; 181/146; 181/151; 181/155

(58) Field of Classification Search .................. 181/145, 181/146, 155, 151
See application file for complete search history.

(56) References Cited

U.S. PATENT DOCUMENTS

| | | | | | |
|---|---|---|---|---|---|
| 3,900,707 | A * | 8/1975 | Hanson | ......................... | 381/370 |
| 5,373,564 | A * | 12/1994 | Spear et al. | .................... | 381/352 |
| 5,824,969 | A * | 10/1998 | Takenaka | ...................... | 181/156 |
| 6,141,428 | A * | 10/2000 | Narus | ........................... | 381/338 |
| 6,275,597 | B1 * | 8/2001 | Roozen et al. | ................ | 381/345 |
| 6,973,994 | B2 * | 12/2005 | Mackin et al. | ................ | 181/156 |
| 7,325,649 | B1 * | 2/2008 | Budge | ........................... | 181/151 |
| 7,565,948 | B2 * | 7/2009 | Parker et al. | .................. | 181/148 |

FOREIGN PATENT DOCUMENTS

GB 2049351 A * 12/1980

* cited by examiner

*Primary Examiner* — Forrest M Phillips
(74) *Attorney, Agent, or Firm* — J. Todd Rushton

(57) ABSTRACT

A durable, high performance, compact subwoofer speaker cabinet having a first elongate speaker tube attached to at least a second elongate tube. The at least a second elongate tube is attached to the first elongate speaker tube using a flying bridge brace structure. The at least a second elongate tube being a sound port or another speaker.

13 Claims, 9 Drawing Sheets

COMPACT SUBWOOFER CABINET

The following application claims priority to Provisional Patent Application No. 61/377,084, filed Aug. 25, 2010. All material disclosed therein, incorporated by reference.

BACKGROUND

As commonly known in the art of speaker cabinets and more specifically, woofer cabinets and subwoofer cabinets, the speaker cabinets generally must be large rigid structures for optimum performance. The traditional speaker cabinet volume is often limited only by the space where the speaker is intended for use, such as the trunk or back seat of a car, and when installed, does not allow for additional use of that space. The traditional speaker cabinets are generally constructed using laminated plywood, particle board or wafer board, which is then covered with carpeting or similar material; these materials makes a finished cabinet relatively heavy. Traditional speaker cabinets will usually have a large rectangular face or front configuration to improve clarity and limit box resonance. Additionally, following extended high volume usage and induced vibration, speaker cabinets constructed of wood or particle board have a tendency to crumble or separate at glued or fastened junctions. What is needed is a durable, high performance, compact subwoofer speaker cabinet with excellent clarity.

SUMMARY OF THE INVENTION

The present invention is a durable, non-traditional, high performance, compact subwoofer speaker cabinet that provides excellent clarity.

A first embodiment of the present invention is a compact subwoofer cabinet for use with a singular speaker. The subwoofer cabinet including a first cylindrical speaker tube having a sealed back portion and a front portion configured to receive a speaker element. A second cylindrical tube, of a smaller diameter, or sound port or resonance tube attached to the outside surface of the first cylindrical speaker tube. A jointing port or communications port allowing for sound and air flow between the first cylindrical speaker tube and the second cylindrical tube. In one embodiment of the present invention, the sound port or resonance tube includes an interior tube, allowing the transmitted sound to resonate in the sound port, prior to passing through a foam filter element and emanating from the sound port.

In one embodiment of the present invention, the compact subwoofer cabinet is comprised of a single cylindrical speaker tube, having a sealed back portion and a front portion configured to receive a speaker element. The cylindrical tube including, a vent port with foam filter element or "mini port" allowing the single cylindrical tube subwoofer to breathe. In another embodiment of the present invention, the vent port is covered with a one-way valve and a bleeder port is drilled into the cylindrical element. The one-way valve allows the pressure to build inside the cylindrical speaker tube each time the speaker element diaphragm moves forward while generating a sound. The increased pressure further accelerates the speaker element on the forward stroke and dampens the reverse stroke, improving speaker response and clarity. The bleeder port, drilled through the cylindrical speaker tube, protects the speaker element from high back pressure and allows excess air to bleed off when the speaker is shut down. In one embodiment of the present invention, the bleeder port may have an adjustable valve, such as a needle valve.

One embodiment the present invention is a subwoofer cabinet where speaker elements are housed in sealed individual cylindrical speaker tubes that are in communication with adjacent cylindrical speaker tubes. For one embodiment of the present invention, there are two cylindrical speaker tubes; in another embodiment of the present invention, there are three cylindrical speaker tubes; in another embodiment of the present invention, there are four cylindrical speaker tubes; and in yet another embodiment of the present invention, there are more than four cylindrical speaker tubes. The cylindrical speaker tubes have a sealed back portion and a front portion including an inset shoulder for mounting a speaker. Each cylindrical speaker tube may be attached to at least one adjacent cylindrical speaker tube using a flying bridge configured brace system and is in communication with the adjacent element via a, tubular conduit or joining port, which penetrates each of the cylindrical speaker tubes. The subwoofer speaker cabinet can be operated or positioned in any orientation as long as the speaker face is not contacted or interfered with, by an outside object.

The sealed cylindrical speaker tubes provide a secure, rigid housing that allows the speaker to perform efficiently and fully without any of the residual case resonance that is present with traditional subwoofer cabinets. The clarity is preserved when adjacent cylindrical elements are connected using the flying bridge brace system. The flying bridge, when configured in opposing pairs, one brace opening up and a second brace opening down, provides a positive rigid engagement between the cylindrical speaker tubes, limiting movement and the corresponding distortion. It is contemplated for large subwoofer speaker systems of the present invention to add flying bridge bracing near the rear of the elongate tubes or to allow the flying bridge bracing to extend the length, or substantially the length, of the speaker cylinder. Additionally, it is asserted that when the adjacent speakers are wired in a parallel configuration, the performance of the system is greater than the sum of its parts. When the sealed air space behind each speaker is in communication with the adjacent speaker, it is theorized that when the speaker cones are retracted they compress the air in the sealed cylinders, which is equalized across the tubular conduit, the compressed air then allows the speakers to move forward more forcefully on the following beat. In another embodiment, to protect the speakers, in larger more powerful systems, it may be necessary to eliminate the tubular conduit and port the elongate tube to open air.

In yet another embodiment of the present invention, the compact subwoofer cabinet is comprised of multiple cylindrical speaker tubes having a sealed back portion and a front portion configured to receive a speaker element. Each cylindrical speaker tube having, a second cylindrical tube, of a smaller diameter, or sound port attached to the outside surface of the cylindrical speaker tube. A jointing port or communications port allowing for sound and air flow between the cylindrical speaker tube and the sound port. The multiple speaker cylinders connected to the adjacent cylinder by a flying bridge bracing system. In one embodiment of the present invention, the sound ports, corresponding to each speaker cylinder, open central to the multiple speaker cylinders and in another embodiment, the sound ports or resonance tubes open or emanate from the outside perimeter of the multiple speaker cylinders. In one embodiment of the present invention, the resonance tube or sound port includes an interior tube or resonance tube, allowing the transmitted sound to resonate in the sound port, prior to passing through a foam filter element and emanating from the sound port at the discharge end of the resonance tube.

In one embodiment, the entire assembly can be constructed using off the shelve components, such as, large diameter ABS or PVC pipe for cylindrical elements, trimmed sections of pipe for the shoulder speaker support, trimmed sections of pipe for the flying bridge brace system, smaller diameter pipe for the tubular conduit and plywood, PVC or ABS sheet material for the back. Assembly can be accomplished by cutting and shaping each section and assembling the speaker cabinet using conventional methods of attachment such as glue and screws.

In another embodiment, the entire assembly can be constructed by injection molding, either as a unitized structure or by injection molding parts that require additional assembly using screws, bolts or glue.

In another embodiment the assembly is cast using polycarbonate or acrylic resins.

In yet another embodiment, the assembly is formed using composite materials such as fiberglass, graphite, Kevlar or similar material. The composite material can be applied to a last or mandrel in a chopped, sheet or filament form and then either air or oven cured.

It is understood that the material used for construction, and the density of that material, changes the sound characteristics of the subwoofer cabinet and that variations in material or a combination of materials may be desired to refine the sound of a subwoofer cabinet.

These and other features and advantages of the disclosure will be set forth and will become more fully apparent in the detailed description that follows and in the appended claims. The features and advantages may be realized and obtained by the instruments and combinations particularly pointed out in the appended claims. Furthermore, the features and advantages of the disclosure may be learned by the practice of the methods or will be obvious from the description, as set forth hereinafter.

BRIEF DESCRIPTION OF THE DRAWINGS

The following description of the embodiments can be understood in light of the Figures, which illustrate specific aspects of the embodiments and are part of the specification. Together with the following description, the Figures demonstrate and explain the principles of the embodiments. In the Figures the physical dimensions of the embodiment may be exaggerated for clarity. The same reference numerals in different drawings represent the same element, and thus their descriptions may be omitted.

DETAIL DESCRIPTION OF THE DRAWINGS

Figure 1:
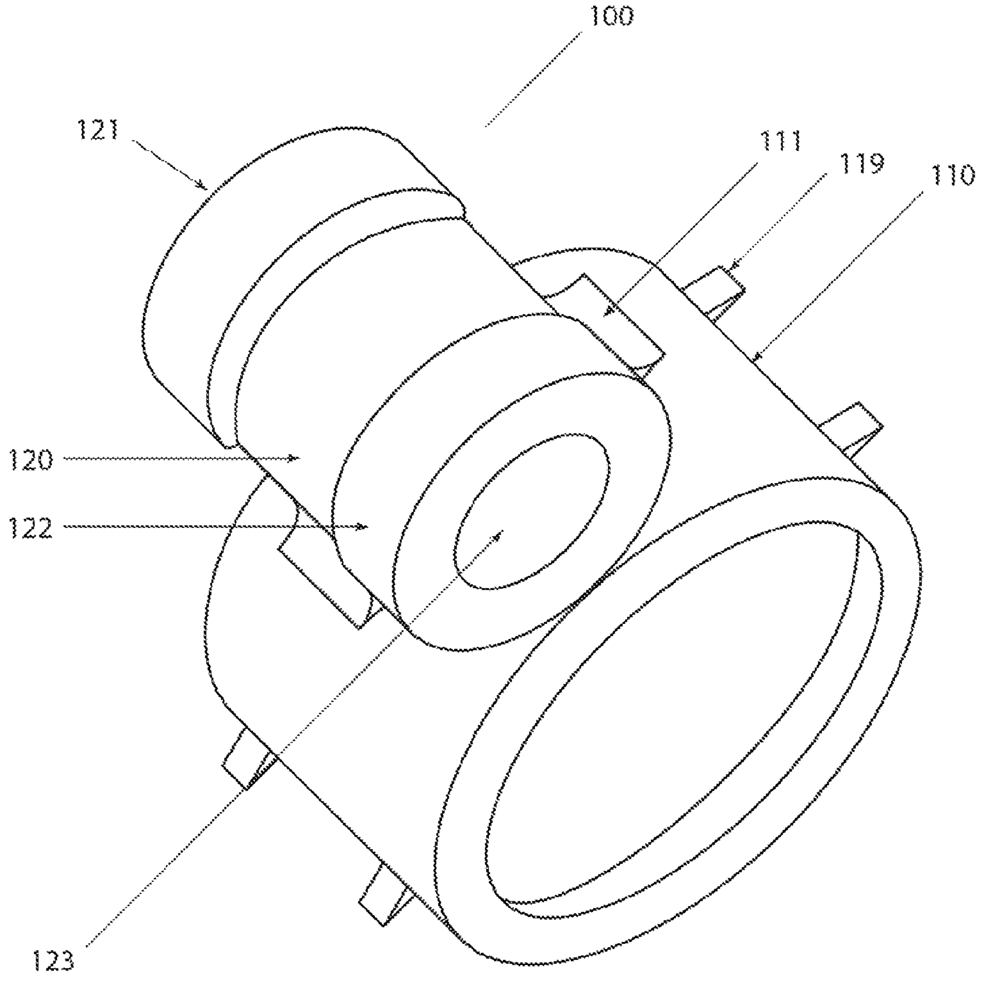
FIG. 1 is an isometric view of a single speaker subwoofer cabinet.
Figure 2:
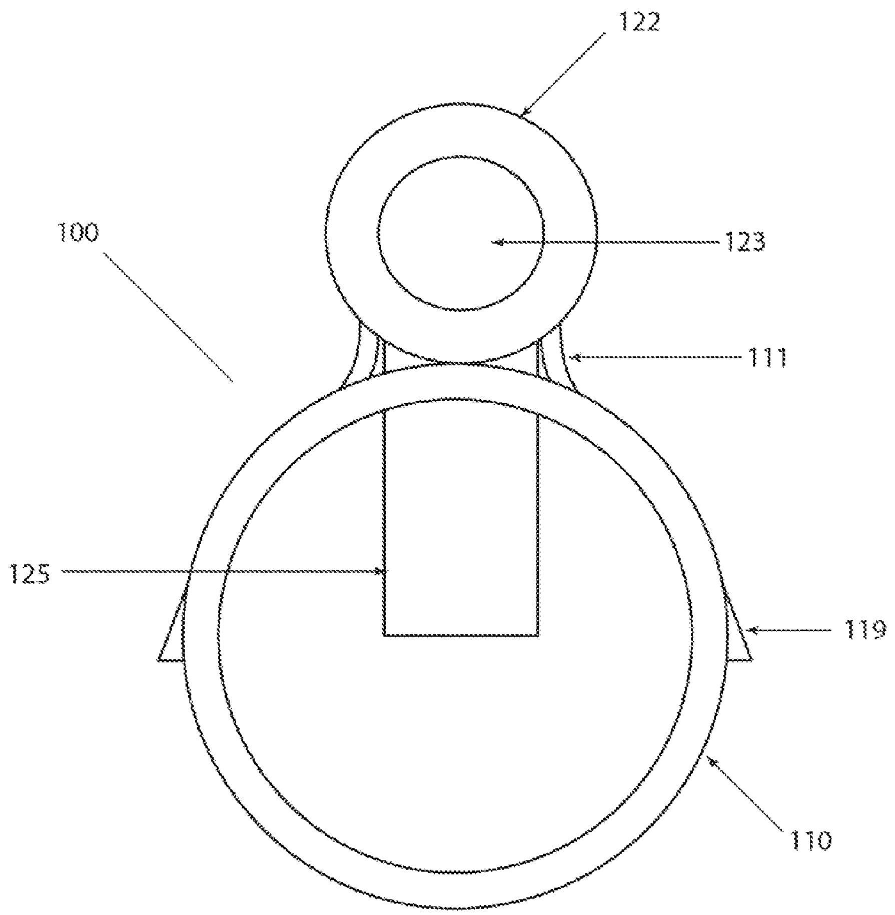
FIG. 2 is a front view of a single speaker subwoofer cabinet.
Figure 3:
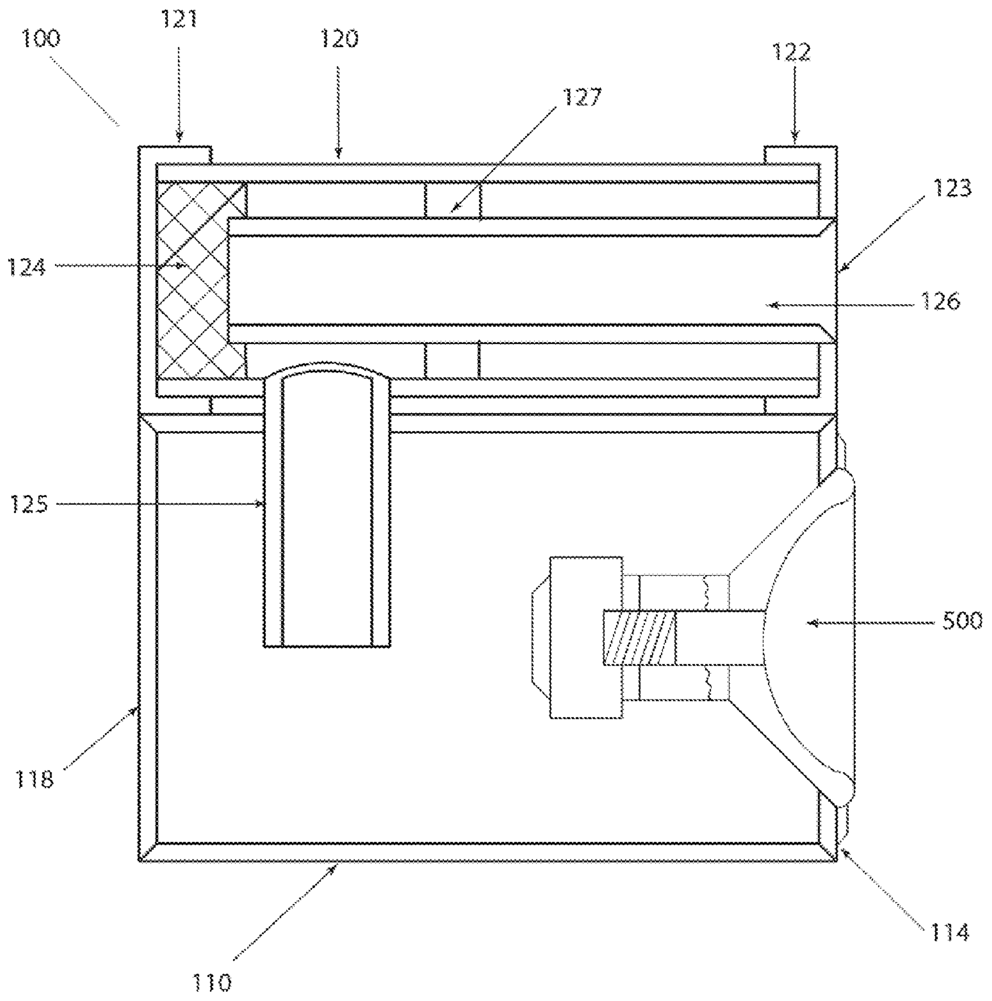
FIG. 3 is a section view of a single speaker subwoofer cabinet.

FIGS. 1, 2 and 3 are a first embodiment of the present invention, or a single speaker compact subwoofer cabinet 100. Compact subwoofer cabinet 100, includes an elongate cylindrical speaker housing 110 having a closed back portion or panel 113 and open front face or aperture 114. A speaker 500 is mounted on the front face 114. The cylindrical element 110 is attached to, and in communication with, a second elongate cylindrical element or sound port 120. Attachment is accomplished using a flying bridge brace assembly 111. Communication tube or tubular conduit 125 connects sound port assembly 120 with the cylindrical speaker housing 110. Sound port assembly 120, includes a rear cover 121, front cover 122 with opening or aperture 123, a resonance tube 126, bracing 127 and foam dampening 124. Sound generated by speaker 500 will primarily emanate from the speaker cone or front; however, back pressure and reverse beats are generated at the back of the speaker and speaker cone. The sound is projected through tubular conduit 125 and into the sound port 120. The back pressure sound is transmitted through tubular conduit 125 and into sound port housing 120, the sound filters through the foam dampening 124, into resonance tube 126 and is projected out from sound port aperture 123. Compact subwoofer speaker cabinet 100 can be placed upright in a stand (not shown) or oriented on one side, supported by feet 119.

Figure 4:
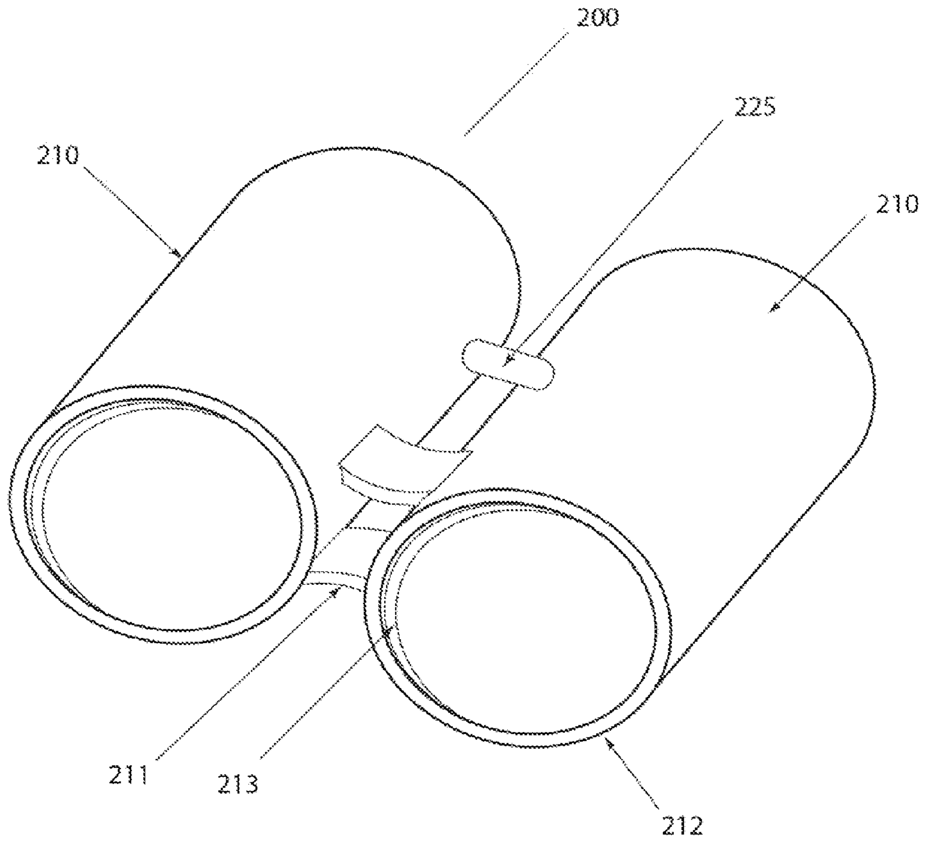
FIG. 4, is an isometric view of a double speaker subwoofer cabinet.
Figure 5:
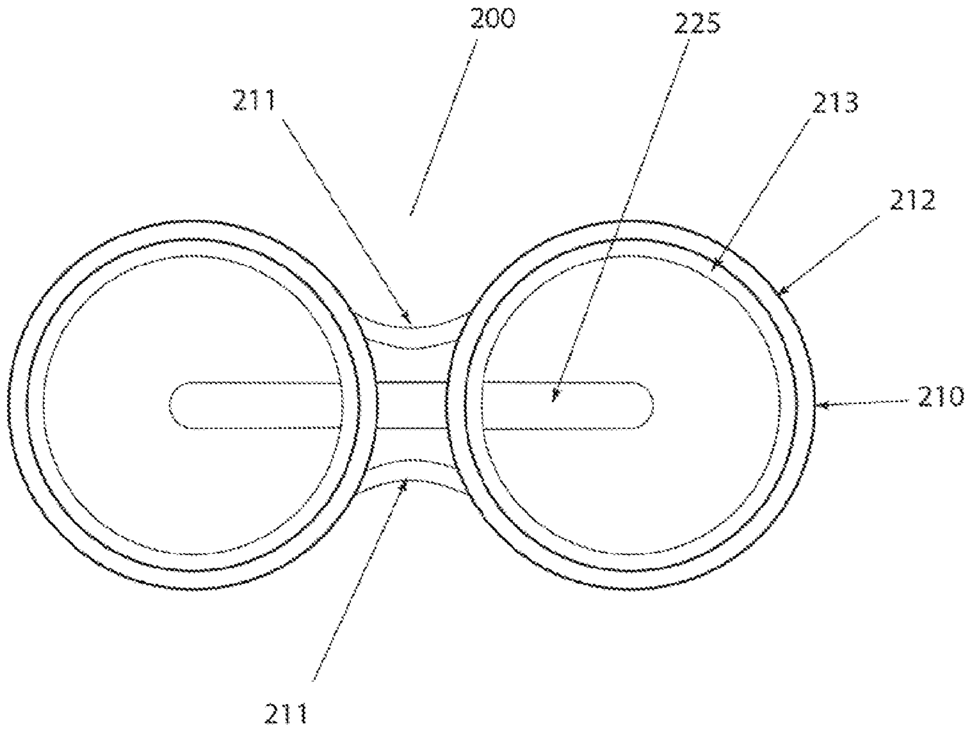
FIG. 5, is a front view of a double speaker subwoofer cabinet.
Figure 6:
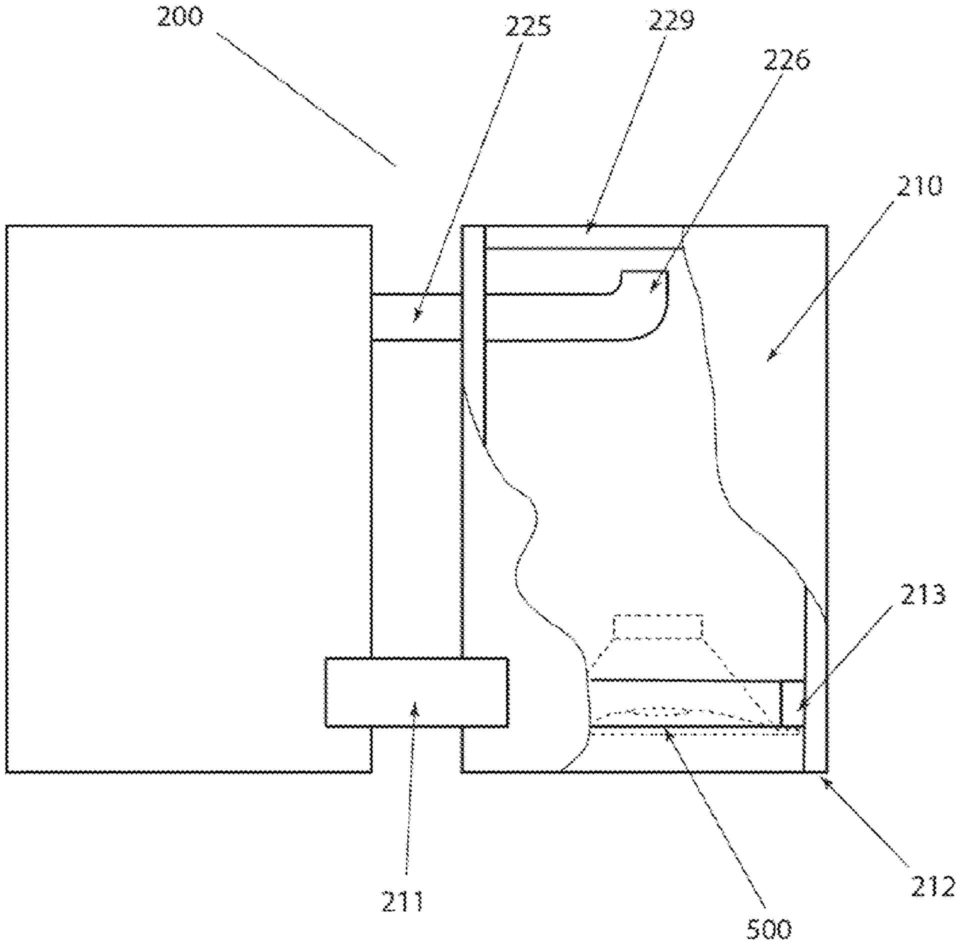
FIG. 6, is a top view of a double speaker subwoofer cabinet with a cut-a-way section for clarity.

FIGS. 4, 5 and 6 are another embodiment of the present invention, or double cylinder compact speaker cabinet 200. Specifically, a compact subwoofer cabinet 200, having elongated cylindrical elements 210, each having a face surface 212, with an inset shoulder 213 utilized to mount the speaker 500. The elongate cylindrical elements 210 are connected together by flying bridge support elements 211, with one element opening up and the second element opening down, the flying bridge support elements 211 provide a rigid connection that preserves audio clarity of the compact subwoofer cabinet 200. The air space inside the cylindrical elements 210 is in communication via the tubular conduit 225. FIG. 3 provides a top view of the compact subwoofer cabinet 200 with a cutaway to reveal some interior details. The elongate cylindrical elements 210, having face surfaces 212, fully sealed rear surfaces 229 and attached by flying bridge supports 211. A speaker support shoulder 213 is recessed from the face 212. Shoulder 213 can be formed integral with cylindrical element 210 or can be attached using glue or screws. A speaker element 500 is mounted on shoulder 213. The present embodiment may or may not include a grill that attached to face 212 and covers the speaker element 500. Tubular conduit 225 provides communication between elongate tubular elements 210 and may include an elbow 226 directing the communicating air flow either toward the sealed rear surface 229, downward, upward or toward the speaker element 500 or elbow 226 may be omitted. Tubular conduit 225 may terminate flush with the inside wall of elongate cylindrical elements 210 or may extend substantially to the center of elongate cylindrical elements 210.

Figure 7:
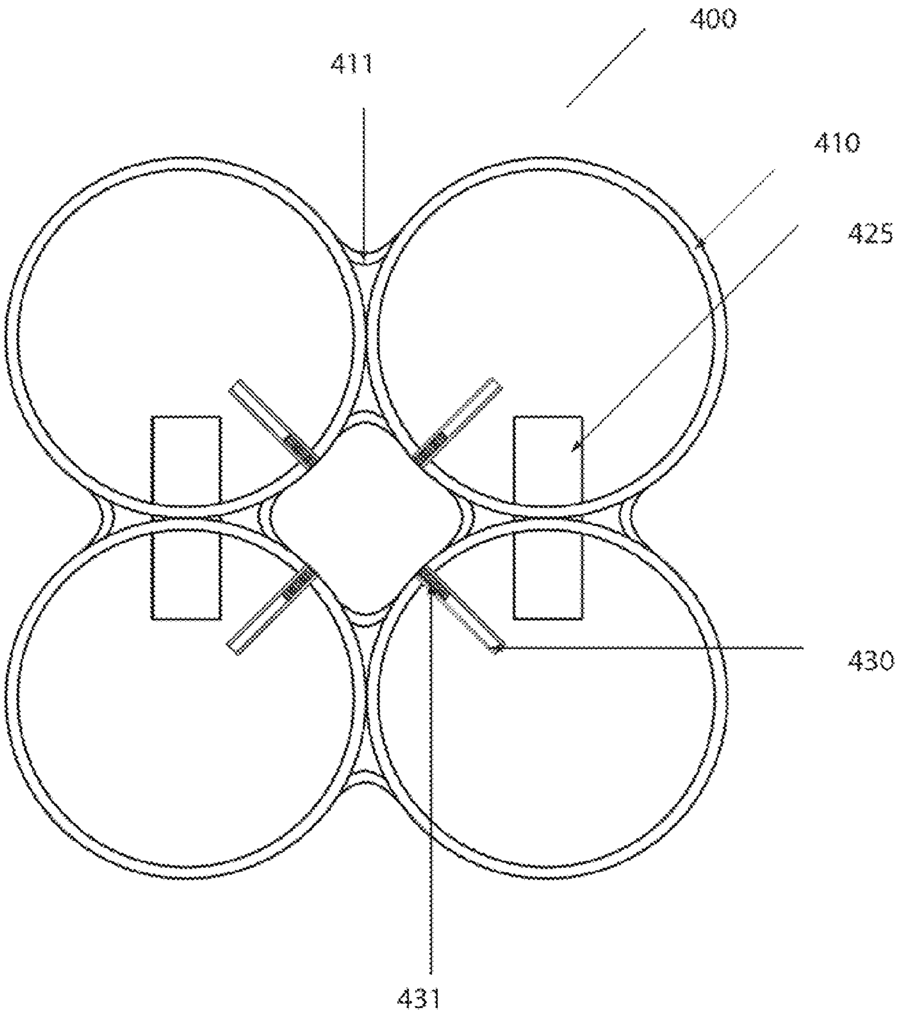
FIG. 7, is multi-speaker subwoofer cabinet having breathing ports.

FIG. 7 is another embodiment of the present invention, or multi-cylinder compact subwoofer speaker cabinet 400. Speaker cabinet 400 including sealed elongate cylinder speaker housings 410 rigidly attached using flying bridge bracings 411. Each elongate cylinder speaking housing 410 in communication with at least one other adjacent speaker housing 410 via tubular conduit 425. The speaker housings 410 are vented to atmosphere using a mini port 430 having a foam filter 431. Mini-port 430 eliminates excess pressure buildup inside of the speaker housing 410.

Figure 8:
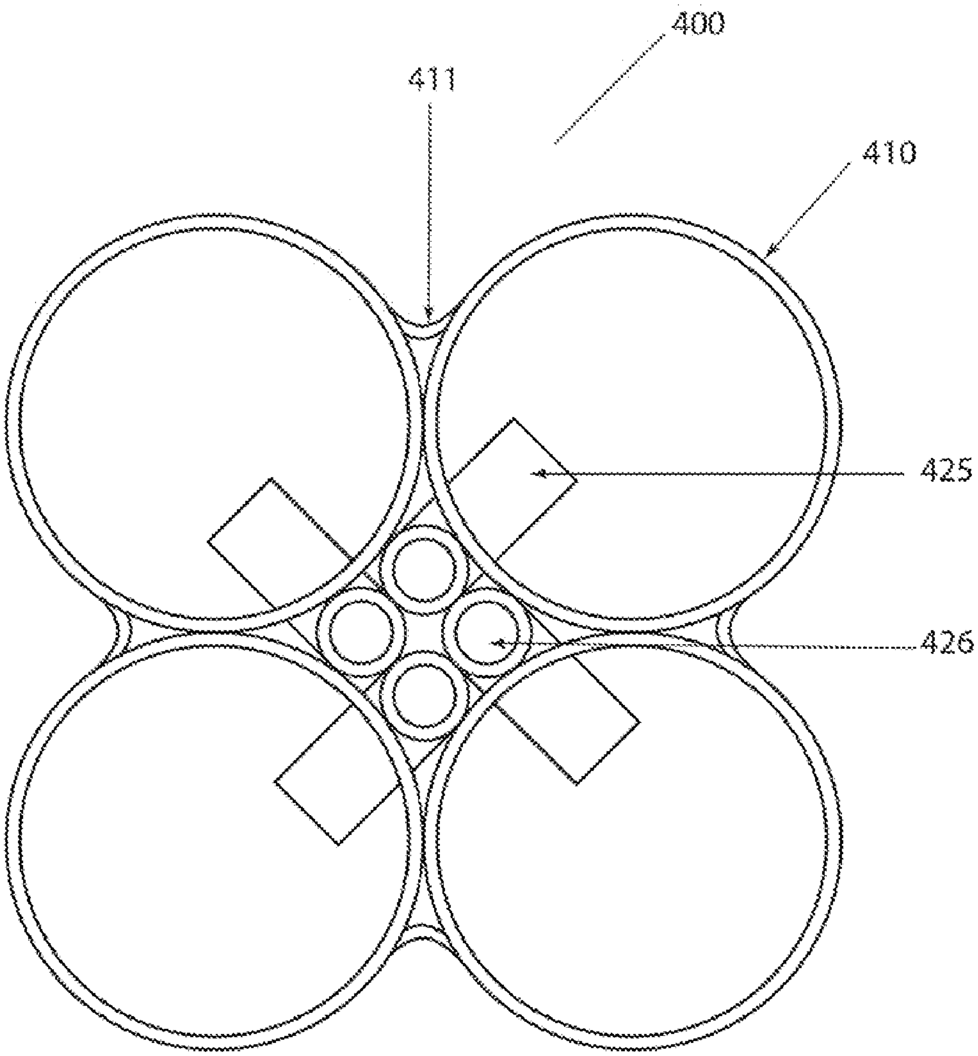
FIG. 8, is multi-speaker subwoofer cabinet having sound ports or resonance tubes.

FIG. 8 is yet another embodiment of the present invention, or multi-cylinder compact subwoofer speaker cabinet 400 having cylindrical speaker housing elements 410, flying bridge connections 411 and tubular sound ports 425, having an open aperture 426. Tubular sound ports 425 may be an open cylinder or may include additional sound enhancements, as shown in FIG. 3.

Figure 9:
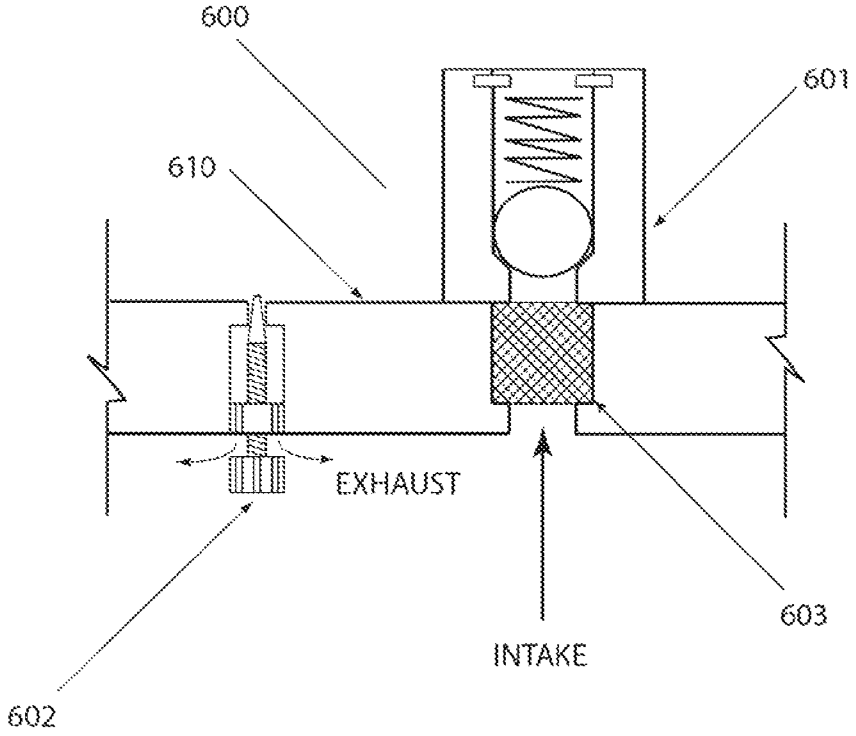
FIG. 9, is schematic drawing of a mechanical breather valve.

FIG. 9 is one embodiment of a mechanical valve housing vent 600. It is understood that as a speaker pulsates back and forth the movement causes the speaker housing 610 to breathe, and in most cases, building in high pressure area behind the speaker element, this increased pressure may create a more stable environment for the speaker element, slowing the reverse movement and increasing speed and energy of a forward beat. It is contemplated that a one way valve 601, such as the ball valve shown, will allow air to be pumped into the speaker cylinder 610 during a forward speaker stroke and is retained at higher pressure behind the speaker. The air intake passes through foam filter 603 which keeps dirt and dust from intruding into the speaker housing. A bleeder port 602 will allow excess pressure to be released. It is contemplated to include an adjustable tap or valve, such as the needle valve shown, to allow fine tuning of the bleeder port 602.

It is to be understood that the above mentioned arrangements are only illustrative of the application of the principles of the present disclosure. Numerous modifications or alternative arrangements may be devised by those skilled in the art without departing from the spirit and scope of the present disclosure and the appended claims are intended to cover such modifications and arrangements. Thus, while the present disclosure has been shown in the drawings and described above with particularity and detail, it will be apparent to those of ordinary skill in the art that numerous modifications, including, but not limited to, variations in size, materials, shape, form, function and manner of operation, assembly and use may be made without departing from the principles and concepts set forth herein.

The invention claimed is:

1. A compact subwoofer speaker cabinet comprising;

a first elongate tube having a linear axis, the first elongate tube forming a cabinet, the first elongate tube having a speaker attached at one end, the speaker facing outward, and, the first elongate tube attached to at least a second elongate tube using a flying bridge brace arrangement to reduce case resonance.

2. The speaker cabinet of claim 1 wherein;

the at least a second elongate tube forming a cabinet, the at least a second elongate tube having a speaker attached at one end, and, the speaker facing outward.

3. The speaker cabinet of claim 2 wherein, the first elongate tube and the at least a second elongate tube having a sound port.

4. The speaker cabinet of claim 2 wherein, the first elongate tube and the at least a second elongate tube are in communication through a tubular conduit.

5. The speaker cabinet of claim 2 wherein, the first elongate tube and the at least a second elongate tube are sealed.

6. The speaker cabinet of claim 5 wherein, the first elongate tube and the at least a second elongate tube including at least one mini-port.

7. The speaker cabinet of claim 6 wherein, the mini-port includes a foam dampener.

8. The speaker cabinet of claim 5 wherein, the first elongate tube and the at least a second elongate tube including a one-way valve.

9. The speaker cabinet of claim 5 including, a bleeder port.

10. The speaker cabinet of claim 9 wherein the bleeder port is adjustable.

11. The speaker cabinet of claim 1 wherein, the at least a second elongate tube is a sound port.

12. The speaker cabinet of claim 11 wherein, the sound port including a resonance tube.

13. The speaker cabinet of claim 12 wherein, the resonance tube including a foam dampener.

* * * * *